United States Patent [19]

Deprez

[11] Patent Number: 5,800,961
[45] Date of Patent: Sep. 1, 1998

[54] IMAGING ELEMENT AND METHOD FOR MAKING A LITHOGRAPHIC PRINTING PLATE ACCORDING TO THE SILVER SALT DIFFUSION TRANSFER PROCESS

[75] Inventor: Lode Deprez, Wachtebeke, Belgium

[73] Assignee: Agfa-Gevaert, N.V., Mortsel, Belgium

[21] Appl. No.: 885,958

[22] Filed: Jun. 30, 1997

Related U.S. Application Data

[60] Provisional application No. 60/026,670 Sep. 25, 1996.

[30] Foreign Application Priority Data

Jul. 30, 1996 [EP] European Pat. Off. .......... 96202156.4

[51] Int. Cl.$^6$ .............. G03F 7/07; G03C 8/06; G03C 8/52
[52] U.S. Cl. .................. 430/204; 430/227; 430/229
[58] Field of Search .................. 430/204, 227, 430/229

[56] References Cited

U.S. PATENT DOCUMENTS

| | | | |
|---|---|---|---|
| 5,281,509 | 1/1994 | Matakata et al. | 430/204 |
| 5,445,915 | 8/1995 | Vaes | 430/204 |
| 5,637,437 | 6/1997 | Vaes et al. | 430/204 |
| 5,641,605 | 6/1997 | Yoshida et al. | 430/204 |

*Primary Examiner*—Richard L. Schilling
*Attorney, Agent, or Firm*—Breiner & Breiner

[57] ABSTRACT

The present invention provides an imaging element comprising on a support in the order given (i) a base layer comprising a binder in an amount between 1 and 4 g/m$^2$, (ii) a photosensitive layer comprising a spectrally sensitised silver halide emulsion, and (iii) a receiving layer containing physical development nuclei in water permeable relationship with said photosensitive layer, characterized in that the base layer contains a latex polymer or copolymer with a glass transition temperature Tg not higher than 40° C.

9 Claims, No Drawings

IMAGING ELEMENT AND METHOD FOR MAKING A LITHOGRAPHIC PRINTING PLATE ACCORDING TO THE SILVER SALT DIFFUSION TRANSFER PROCESS

Benefit is claimed under 35 USC 119(E) from provisional application 60/026,670, filed Sep. 25, 1996.

FIELD OF THE INVENTION

The present invention relates to an imaging element, for making improved lithographic printing plates according to the silver salt diffusion transfer process.

The present invention further relates to a method for making improved lithographic printing plates according to the silver salt diffusion transfer process.

BACKGROUND OF THE INVENTION

The principles of the silver complex diffusion transfer reversal process, hereinafter called DTR-process, have been described e.g. in U.S. Pat. No. 2,352,014 and in the book "Photographic Silver Halide Diffusion Processes" by Andre Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image-receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background.

The DTR-image can be formed in the image-receiving layer of a sheet or web material which is a separate element with respect to the photographic silver halide emulsion material (a so-called two-sheet DTR-element) or in the image-receiving layer of a so-called single-support-element, also called mono-sheet element, which contains at least one photographic silver halide emulsion layer integral with an image-receiving layer in waterpermeable relationship therewith. It is the latter mono-sheet version which is preferred for the preparation of offset printing plates by the DTR method. For example the United Kingdom Patent Specification 1,241,661 discloses a method for the production of a planographic printing plate consisting of a sheet material comprising an outer hydrophilic colloid layer on the surface of which there is concentrated a silver image stemming from an underlying exposed silver halide emulsion layer by the silver complex diffusion transfer reversal process. The silver image formed on the surface is suitable for printing images in a lithographic printing process using a dampening liquid.

Commercial lithographic printing plate precursors of the latter type typically contain on a support in the order given a base layer serving as an anti-halation layer, a silver halide emulsion layer and a surface layer containing physical development nuclei in which the silver image is formed.

Such lithographic printing plate precursors, also called imaging elements may be camera exposed or they can be exposed by means of a scan exposure e.g. a laser or L.E.D. exposure. The latter offers the advantage that the preparation of the printing plate is simplified in that a paste-up to be used for the exposure of the imaging element can be completely prepared on a computer. This paste-up prepared on the computer is then transferred to an image setter equiped with e.g. a laser that takes care of the exposure of the imaging element.

A photographic DTR material preferably comprises a silver halide emulsion mainly consisting of silver chloride in order to obtain a sufficiently high rate of solution of the silver halide and a satisfactory gradation necessary for graphic purposes. Only a small amount of silver bromide and/or silver iodide usually not exceeding 5 mole % is present.

However, these imaging elements are very sensitive to scratchability in wet state. This is a serious drawback because this type of lithographic printing plate is wetted before mounted on the printing press. The mounting of the wet printing plate on the printing press requires a lot of difficult handlings. During said handlings there is a fair chance that the wet printing plates are touched by one of the tools used, resulting in a scratch on the printing plate. So a solution for said problem would be welcomed.

DE-A-4,230,058 discloses a photographic element for the preparation of lithographic plates by the DTR-process. Said plates includes top-layers which contains inswellable latices. Howeversaid latices are not described by their Tg.

SUMMARY OF INVENTION

It is an object of the present invention to provide an imaging element that can yield printing plates of improved quality, i.e. less scratchability in the wet state.

It is a further object of the present invention to provide a method for making a printing plate according to the silver salt diffusion transfer process.

Further objects of the present invention will become clear from the description hereinafter.

According to the present invention there is provided an imaging element comprising on a support in the order given (i) a base layer comprising a binder in an amount between 1 and 4 g/m$^2$, (ii) a photosensitive layer comprising a spectrally sensitised silver halide emulsion, and (iii) a receiving layer containing physical development nuclei in water permeable relationship with said photosensitive layer, characterized in that the base layer contains a latex polymer or copolymer with a glass transition temperature( furtheron abbreviated as Tg) not higher than 40° C.

According to the present invention there is further provided a method for making a lithographic printing plate comprising the steps of image-wise exposing an imaging element as defined above and subsequently developing a thus obtained imaging element by an alkaline processing liquid in the presence of at least a developing agent and at least a silver halide solvent.

DETAILED DESCRIPTION OF THE PRESENT INVENTION

By making use of an imaging element as described above wherein the base layer comprises a latex with a Tg of not higher than 40° C. the number and density of scratches in said imaging material in wet state are substantially reduced. Preferably the Tg of the latex in the base layer is not higher than 35° C. Suitable latices according to the invention are copolymers of styrene and butadiene, copolymers of styrene, butadiene and acrylonitrile, copolymers of acrylic acid and acrylonitrile, copolymers of acrylic acid and styrene, and copolymers of ethyl(meth)acrylate and methyl(meth)acrylate.

More preferred latices according to the invention are copolymers having between 1 and 99 mole % of isoprene, more preferably between 20 and 80 mole % of isoprene.

Most preferred latices according to the invention are copolymers having as monomers at least isoprene and styrene having between 10 and 90 mole % of isoprene and between 10 and 90 mole % of styrene, more preferentially having between 20 and 80 mole % of isoprene and 20 to 80 mole % of styrene.

The weight ratio between the binder and the latex ranges preferably from 20 to 0.5, more preferably between 10 and 0.75, most preferably between 5 and 1.

The number average diameter of the latices according to the invention is preferably not higher than 500 nm, more preferably between 20 and 250 nm, bimodale distributions are also effective.

The imaging element in connection with the present invention essentially comprises on one side of a support a base layer comprising the above described latex, a photosensitive layer comprising a silver halide emulsion and an image receiving layer containing physical development nuclei in water permeable relationship with said emulsion layer.

Layers being in waterpermeable contact with each other are layers that are contiguous to each other or only separated from each other by (a) waterpermeable layer(s). The nature of a waterpermeable layer is such that it does not substantially inhibit or restrain the diffusion of water or of compounds contained in an aqueous solution e.g. developing agents or complexed silver ions.

Supports suitable for use in accordance with the present invention may be opaque or transparent, e.g. a paper support or resin support. When a paper support is used preference is given to one coated at one or both sides with an Alpha-olefin polymer, e.g. a polyethylene layer which optionally contains an anti-halation dye or pigment. It is also possible to use an organic resin support e.g. cellulose nitrate film, cellulose acetate film, poly(vinyl acetal) film, polystyrene film, poly (ethylene terephthalate) film, polycarbonate film, polyvinylchloride film or poly-Alpha-olefin films such as polyethylene or polypropylene film. The thickness of such organic resin film is preferably comprised between 0.07 and 0.35 mm. These organic resin supports are preferably coated with a layer improving the adhesion of the gelatin containing layers.

A particularly suitable adhesion improving layer, comprises a copolymer containing water-soluble monomers and water-insoluble monomers in a molar ratio between 1:99 and 20:80. Preferably the water soluble monomer is a monomer having one or more carboxylic acid groups. An example of an especially preferred copolymer for use in said adhesion improving layer is a polymer containing 1% to 10% by weight, more preferably 1% to 5% by weight of itaconic acid or maleic acid. Suitable polymers containing maleic acid or itaconic acid are e.g. copolymers of itaconic acid or maleic acid and vinylidene chloride, copolymers of itaconic acid or maleic acid, vinylidene chloride and vinylacetate, copolymers of itaconic acid or maleic acid, vinylidene chloride and methyl (meth)acrylate, copolymers of itaconic acid or maleic acid and vinyl chloride, copolymers of itaconic acid, vinyl chloride, vinylidene chloride and methyl(meth) acrylate etc . . . . A particular suitable copolymer of itaconic acid or maleic acid, vinylidene chloride and optionally methyl(meth)acrylate is one wherein the amount of itaconic acid or maleic acid is between 1% and 5%, the amount of vinylidene chloride is between 70% and 95% and the amount of methyl(meth)acrylate is between 0% and 15%. The adhesion improving layer is preferably free of gelatin. It is obvious that the described adhesion improving layer is also applicable on the back-side of the imaging element.

On top of this adhesion improving layer there may be provided a further intermediate layer containing microparticles having an average diameter of less than 50 nm preferably being colloidal silica and gelatin preferably in a weight ratio of 1:2 and 2:1. This layer can further comprise a latex in the amount between 0.1 and 10 mg/m$^2$ with a weight average diameter between 1 and 10 μm, more preferably between 2 and 5 μm.

The photographic silver halide emulsions can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

The photographic silver halide emulsions used according to the present invention can be prepared by mixing the halide and silver solutions in partially or fully controlled conditions of temperature, concentrations, sequence of addition, and rates of addition. The silver halide can be precipitated according to the single-jet method or the double-jet method.

The silver halide particles of the photographic emulsions used according to the present invention may have a regular crystalline form such as a cubic or octahedral form or they may have a transition form. They may also have an irregular crystalline form such as a spherical form or a tabular form, or may otherwise have a composite crystal form comprising a mixture of said regular and irregular crystalline forms.

The silver halide emulsion for use in connection with the present invention is a silver chlor(obrom)ide emulsions that contain silver bromide in the range from 0.0 mole % to 40 mole % and that may contain upto 2 mole % of silver iodide. Preferably, the amount of silver bromide is between 1 mole % and 30 mole %. An emulsion comprising more than 5 mole % of silver bromide preferably belongs to the core/shell type well known to those skilled in the art in the sense that substantially all the bromide is concentrated in the core. This core contains preferably 10 to 40 % of the total silver halide precipitated, while the shell consist preferably of 60 to 90 % of the total silver precipitated. A particularly preferred silver halide emulsion of this type is described in U.S. Pat. No. 5,059,508.

More preferably the silver halide emulsion comprises at least 95 mole % of silver chloride, between 0 and 5 mole % of silver bromide and between 0.1 and 1 mole % of silver iodide.

The average size of the silver halide grains may range from 0.10 to 0.70 μm, preferably from 0.25 to 0.45 μm.

The size distribution of the silver halide particles of the photographic emulsions to be used according to the present invention can be homodisperse or heterodisperse. A homodisperse size distribution is obtained when 95% of the grains have a size that does not deviate more than 30% from the average grain size.

Preferably during the precipitation stage Iridium and/or Rhodium containing compounds or a mixture of both are added. The concentration of these added compounds ranges from $10^{-8}$ to $10^{-3}$ mole per mole of $AgNO_3$, preferably between $10^{-7}$ and $10^{-5}$ mole per mole of $AgNO_3$. This results in the building in in the silver halide crystal lattice of minor amounts of Iridium and/or Rhodium, so-called Iridium and/or Rhodium dopants. As known to those skilled in the art numerous scientific and patent publications disclose the addition of Iridium or Rhodium containing compounds or compounds containing other elements of Group VIII of the Periodic System during emulsion preparation.

The emulsions can be chemically sensitized e.g. by adding sulphur-, seleno- and/or telluro-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R.KOSLOWSKY, Z. Wiss. Photogr. Photophys. Photochem. 46, 65–72 (1951).

The emulsions of the DTR-element can be spectrally sensitized according to the spectral emission of the exposure source for which the DTR-element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

In the case of a conventional light source, e.g. tungsten light, or a green laser a green sensitizing dye is needed. In case of exposure by an argon ion laser a blue sensizing dye is incorporated. In case of exposure by a red light emitting source, e.g. a LED or a HeNe laser a red sensitizing dye is used. In case of exposure by a semiconductor laser special spectral sensitizing dyes suited for the near infra-red are required. Suitable infra-red sensitizing dyes are disclosed in i.a. U.S. Pat. Nos. 2,095,854, 2,095,856, 2,955,939, 3,482, 978, 3,552,974, 3,573,921, 3,582,344, 3,623,881 and 3,695, 888.

A preferred blue sensitizing dye, green sensitizing dye, red sensitizing dye and infra-red sensitizing dye in connection with the present invention are described in EP-A 554,585.

To enhance the sensitivity in the red or near infra-red region use can be made of so-called supersensitizers in combination with red or infra-red sensitizing dyes. Suitable supersensitizers are described in Research Disclosure Vol 289, May 1988, item 28952.

The spectral sensitizers can be added to the photographic emulsions in the form of an aqueous solution, a solution in an organic solvent or in the form of a dispersion.

The silver halide emulsions may contain the usual stabilizers. Suitable stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable stabilizers are i.a. heterocyclic mercapto compounds e.g. phenylmercaptotetrazole, quaternary benzothiazole derivatives, and benzotriazole. Preferred compounds are mercapto substituted pyrimidine derivatives as disclosed in U.S. Pat. No. 3,692,527.

The silver halide emulsions may contain pH controlling ingredients. Preferably the emulsion layer is coated at a pH value near the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. No. 4,092,168, U.S. Pat. No. 4,311,787 and DE-P 2,453,217.

More details about the composition, preparation and coating of silver halide emulsions can be found in e.g. Product Licensing Index, Vol. 92, December 1971, publication 9232, p. 107–109.

The layer containing physical development nuclei can be free of hydrophilic binder but preferably comprises amounts upto 80% by weight of the total weight of said layer of a hydrophilic colloid e.g. polyvinyl alcohol or polyacryl amide or copolymers thereof to improve the hydrophilicity of the surface. Preferred development nuclei for use in accordance with the present invention are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are heavy metal salts such as e.g. selenides, polyselenides, polysulphides, mercaptans, and tin (II) halides. Heavy metals, preferably silver, gold, platinum, palladium, and mercury can be used in colloidal form.

Between the support or eventually the adhesion improving layer or the intermediate layer and the silver halide emulsion layer there is provided said base layer that contains a binder in an amount between 1 and 4 g/m$^2$, preferably between 1.5 and 3 g/m$^2$. Preferably, said base layer contains an anti-halation substance such as e.g. light-absorbing dyes absorbing the light used for image-wise exposure of the imaging element. As alternative finely divided carbon black can be used as an anti-halation substance. On the other hand, in order to gain sensitivity, light reflecting pigments, e.g. titaniumdioxide can be present in the base layer. Further this layer can contain hardening agents, matting agents, e.g. silica particles, and wetting agents. Suitable matting agents preferably have an average diameter of 2–10 µm and more preferably between 2 µm and 5 µm. The matting agents are generally used in a total amount in the imaging element of 0.1 g/m$^2$ to 2.5 g/m$^2$. At least part of these matting agents and/or light reflection pigments may also be present in the silver halide emulsion layer and/or in the cover layer. As a further alternative the light reflecting pigments may be present in a separate layer provided between the base layer and the photosensitive silver halide emulsion layer. Like the emulsion layer the base layer is coated preferably at a pH value near the isoelectric point of the gelatin in the base layer.

According to a particular embodiment in connection with the present invention the base layer also contains a filler which may partially replace the binder of the base layer. Suitable fillers for use in connection with the present invention are inorganic particles, e.g. silica, titane dioxide, having an average particle diameter of 3 nm to 100 nm. A particularly preferred filler is colloidal silica having an average particle diameter of 4 to 20 nm. It has been found that the addition of a filler to the base layer improves the hydrophilic character of the non-image areas and consequently enhances the difference in ink acceptance between the image and non-image areas. The filler particles can be used in an amount of 0.1 to 1.5 g/m$^2$ and more preferably in an amount of 0.2 to 0.9 g/m². Mixtures of different type of filler particles may also be used.

In a preferred embodiment in connection with the present invention a backing layer is provided at the non-light sensitive side of the support. This layer which can serve as anti-curl layer can contain i.a. matting agents e.g. silica particles, lubricants, antistatic agents, light absorbing dyes, opacifying agents, e.g. titanium oxide and the usual ingredients like hardeners and wetting agents. The backing layer can consist of one single layer or a double layer pack and can be transparent or opaque.

The hydrophilic layers usually contain gelatin as hydrophilic colloid binder. Mixtures of different gelatins with different viscosities can be used to adjust the rheological properties of the layer. Like the emulsion layer the other hydrophilic layers are coated preferably at a pH value near the isoelectric point of the gelatin. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

The hydrophilic layers of the photographic element, especially when the binder used is gelatin, can be hardened with appropriate hardening agents such as those of the vinylsulfone type e.g. methylenebis(sulfonylethylene), aldehydes e.g. formaldehyde, glyoxal, and glutaraldehyde, N-methylol compounds e.g. dimethylolurea and methyloldimethylhydantoin, active halogen compounds e.g. 2,4-dichloro-6-hydroxy-s-triazine, triacrylformal and mucohalogenic acids e.g. mucochloric acid and mucophenoxychloric acid. These hardeners can be used alone or in combination. The binders can also be hardened with fast-reacting hardeners such as carbamoylpyridinium salts of the type, described in U.S. Pat. No. 4,063,952.

Preferably used hardening agents are of the aldehyde type. The hardening agents can be used in wide concentration range but are preferably used in an amount of 4% to 7% of the hydrophilic colloid. Different amounts of hardener can be used in the different layers of the imaging element or the hardening of one layer may be adjusted by the diffusion of a hardener from another layer.

The imaging element used according to the present invention may further comprise various kinds of surface-active agents in the photographic emulsion layer or in at least one other hydrophilic colloid layer. Examples of suitable surface-active agents are described in e.g. EP 545452. Preferably compounds containing perfluorinated alkyl groups are used.

The photographic material of the present invention may further comprise various other additives such as e.g. compounds improving the dimensional stability of the photographic element, UV-absorbers, spacing agents and plasticizers.

The above described DTR mono-sheet imaging element in connection with the present invention is exposed in an apparatus according to its particular application, e.g. a conventional process camera containing a conventional light source or a LED or a laser containing device. Subsequently the imaged element is developed with an alkaline processing liquid in the presence of at least a developing agent and at least a silver halide solvent.

Silver halide developing agents for use in accordance with the present invention are preferably of the p-dihydroxybenzene type, e.g. hydroquinone, methylhydroquinone or chlorohydroquinone. When they are incorporated in the the imaging element, they are preferably incorporated in the photosensitive layer and/or in the image receiving layer preferentially in a total amount between 200 and 800 mg/g silver halide, more preferentially in an amount between 300 and 600 mg/g silver halide;

Said developing agents of the p-hydroxybenzene type are preferably used in combination with an auxiliary developing agent being a 1-phenyl-3-pyrazolidinone-type developing agent and/or p-monomethylaminophenol. Particularly useful auxiliary developing agents are of the phenidone type e.g. 1-phenyl-3-pyrazolidinone, 1-phenyl-4-monomethyl-3-pyrazolidinone, and 1-phenyl-4,4-dimethyl-3-pyrazolidinone. Even more preferred, particularly when they are incorporated into the photographic material are 1-phenyl-3-pyrazolidones of which the aqueous solubility is increased by a hydrophilic substituent such as e.g. hydroxy, amino, carboxylic acid group, sulphonic acid group etc. Examples of 1-phenyl-3-pyrazolidones subsituted with one or more hydrophilic groups are e.g. 1-phenyl-4,4-dimethyl-2-hydroxy-3-pyrazolidone, 1-(4-carboxyphenyl)-4,4-dimethyl-3-pyrazolidone etc. However other developing agents can be used.

At least the auxiliary developing agents are preferably incorporated into the photographic material, preferably in the silver halide emulsion layer of the photographic material, in an amount of less than 500 mg/g of silver halide expressed as $AgNO_3$, more preferably in an amount of less than 350 mg/g of silver halide expressed as $AgNO_3$.

The alkaline processing liquid used for developing the imaging element in accordance with the method of the present invention preferably contains a silver halide solvent. Preferably the silver halide solvent is used in an amount between 0.01% by weight and 10% by weight and more preferably between 0.05% by weight and 8% by weight. Suitable silver halide solvents for use in connection with the present invention are e.g. 2-mercaptobenzoic acid, cyclic imides, oxazolidones and thiosulfates. Silver halide solvents that are preferably used in connection with the present invention are thiocyanates and alkanolamines.

Alkanolamines that are suitable for use in connection with the present invention may be of the tertiary, secondary or primary type. Examples of alkanolamines that may be used in connection with the present invention correspond to the following formula:

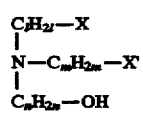

wherein X and X' independently represent hydrogen, a hydroxyl group or an amino group, 1 and m represent 0 or integers of 1 or more and n represents an integer of 1 or more. Preferably used alkanolamines are e.g. N-(2-aminoethyl)ethanolamine, diethanolamine, N-methylethanolamine, triethanolamine, N-ethyldiethanolamine, diisopropanolamine, ethanolamine, 4-aminobutanol, N,N-dimethylethanolamine, 3-aminopropanol, N,N-ethyl-2,2'-iminodiethanol, 2-aminoethyl-aminoethanol etc. or mixtures thereof.

According to the present invention the alkanolamines are preferably present in the alkaline processing liquid. However part or all of the alkanolamine can be present in one or more layers of the imaging element.

A further suitable type of silver halide solvents are thioether compounds. Preferably used thioethers correspond to the following general formula:

$$Z-(R^1-S)_t-R^2-S-R^3-Y$$

wherein Z and Y each independently represents hydrogen, an alkyl group, an amino group, an ammonium group, a hydroxyl, a sulfo group, a carboxyl, an aminocarbonyl or an aminosulfonyl, $R^1$, $R^2$ and $R^3$ each independently represents an alkylene that may be substituted and optionally contain an oxygen bridge and t represents an integer from 0 to 10. Examples of thioether compounds corresponding to the above formula are disclosed in e.g. U.S. Pat. No. 4,960,683 and EP-A 547,662, which therefor are incorporated herein by reference.

Still further suitable silver halide solvents are meso-ionic compounds. Preferred meso-ionic compounds for use in connection with the present invention are triazolium thiolates and more preferred 1,2,4-triazolium-3-thiolates.

Preferably at least part and more preferably all of the meso-ionic compound is present in the alkaline processing liquid used for developing the image-wise exposed imaging element. Preferably the amount of meso-ionic compound in the alkaline processing liquid is between 0.1 mmol/l and 25 mmol/l and more preferably between 0.5 mmol/l and 15 mmol/l and most preferably between 1 mmol/l and 8 mmol/L.

However the meso-ionic compound may be incorporated in one or more layers comprised on the support of the imaging element. The meso-ionic compound is in that case preferably contained in the imaging element in a total amount between 0.1 and 10 mmol/m², more preferably between 0.1 and 5 mmol/m² and most preferably between 0.5 and 1.5 mmol/m². More details are disclosed in EP-A-0,554,585

Combinations of different silver halide solvents can be used and it is also possible to incorporate at least one silver halide solvent into a suitable layer of the imaging element and to add at least one other silver halide solvent to the developing or activating solution. Preferably they are comprised in the alkaline processing liquid.

The alkaline processing liquid used in accordance with the present invention preferably has a pH between 9 and 14 and more preferably between 10 and 13. Said pH may be established by an organic or inorganic alkaline substance or a combination thereof. Suitable inorganic alkaline substances are e.g. potassium or sodium hydroxide, carbonate, phosphate etc. Suitable organic alkaline substances are e.g. alkanolamines. In the latter case the alkanolamines will provide or help maintain the pH and serve as a silver halide complexing agent.

According to the present invention the alkaline processing liquid used for developing an imaging element as described above preferably also contains hydrophobizing agents for improving the hydrophobicity of the silver image obtained in the image receiving layer. The hydrophobizing agents used in connection with the present invention are compounds that are capable of reacting with silver or silver ions and that are hydrophobic i.e. insoluble in water or only slightly soluble in water. Generally these compounds contain a mercapto group or thiolate group and one or more hydrophobic substituents e.g. an alkyl group containing at least 3 carbon atoms. Examples of hydrophobizing agents for use in accordance with the present invention are e.g. those described in U.S. Pat. No. 3,776,728, and U.S. Pat. No. 4,563,410. Preferred compounds correspond to one of the following formulas:

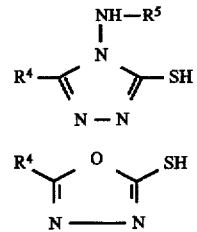

wherein $R^5$ represents hydrogen or an acyl group, $R^4$ represents alkyl, aryl or aralkyl. Most preferably used compounds are compounds according to one of the above formulas wherein $R^4$ represents an alkyl containing 3 to 16 C-atoms.

According to the present invention the hydrophobizing agents are contained in the alkaline processing liquid in an amount of at least 0.1 g/l, more preferably at least 0.2 g/l and most preferably at least 0.3 g/l. The maximum amount of hydrophobizing agents will be determined by the type of hydrophobizing agent, type and amount of silver halide solvents etc. Typically the concentration of hydrophobizing agent is preferably not more than 1.5 g/l and more preferably not more than 1 g/l.

The alkaline processing liquid preferably also contains a preserving agent having antioxidation activity, e.g. sulphite ions. Further may be present a thickening agent, fog inhibiting agents e.g. a benzotriazole which is known to improve the printing endurance, calcium-sequestering compounds, anti-sludge agents, development accelerators and hardeners including latent hardeners.

The development step is preferably followed by a neutralization of the surface of the imaged element by guiding the element through a neutralization liquid having a pH between 4 and 8. The pH of a fresh neutralizing solution lies preferably between 5 and 7. The neutralization liquid preferably contains a buffer e.g. a phosphate buffer, a citrate buffer, an amine or a mixture thereof. The neutralization solution can further contain bactericides, e.g. phenol, thymol or 5-bromo-5-nitro-1,3-dioxan as described in EP-150,517, wetting agents e.g. saponins or pluronics etc. The liquid can also contain substances which influence the hydrophobic/hydrophilic balance of the printing plate obtained after processing of the DTR element, e.g. silica. Finally the neutralization solution can contain wetting agents, preferably compounds containing perfluorinated alkyl groups.

To further improve the differentiation between the hydrophobic silver image and the hydrophilic background the neutralization solution preferably contains one or more hydrophobizing agents. Suitable compounds according to the invention are those mentioned above and long chain (at least 5 carbon atoms) alkyl substituted mercaptotetrazoles.

A lithographic printing plate is thus obtained.

The invention will now be illustrated by the following examples without however the intention to limit the invention thereto. All parts are by weight unless otherwise specified.

EXAMPLE 1

Preparation of the silver halide emulsion coating solution.

A gelatin silver halide emulsion was prepared using the double jet precipitation by mixing whilst stirring an aqueous solution of $AgNO_3$ having a concentration of 3 mole/l, and an aqueous solution having a concentration of 3 mole/l of NaCl and 0.054 mole/l of KBr. Before the precipitation $5*10^{-4}$ mole/l of sodium hexachlororhodaat was added to the alkali halide solution.

The temperature during the silver halide formation was 50° C. The obtained emulsion was cooled, flocculated and washed. Gelatin was added in an amount sufficient to reach a ratio of ⅔ by weight of gelatin to silver halide, expressed as equivalent amount of silver nitrate.

Subsequently a chemical ripening of the emulsion was carried out in a conventional way, known to those skilled in the art, by first adding 0.02 mole KI per mole $AgNO_3$ and subsequently thiosulphate and gold salts. A silver chlorobromoiodide emulsion composed of 98.0 mole % of chloride, 1.8 mole % of bromide and 0.2 mole % of iodide and containing Rhodium ions as internal dopant was so prepared. The average silver halide grain size was 0.4 μm (diameter of a sphere with equivalent volume). 4-hydroxy-6-methyl-1,3,3a,7-tetraazaindene was added as stabilizer in an amount of 290 mg/mole of silver halide.

Prior to coating the emulsion was red sensitised using a mixture of two red sensitizing dyes. Subsequently an arylsulphonylamido-mercaptobenzothiazole (100 mg/mole silver halide) and 7-sulpho-nafto-(2,3-d)-oxazolidine-2-thione (330 mg/mole of silver halide) were added to the emulsion. Finally a dispersion of silica with a weight average diameter between 3.5 and 4.1 μm was added in an amount of 30.4 g/mole silver halide.

A base layer coating solution was prepared having the following composition:

| | |
|---|---|
| gelatin | 5.5% |
| carbon black | 0.49% |
| latex copolymer | 2.95% |
| $TiO_2$ | 11.35% |

Preparation of the imaging elements 1 to 11.

The emulsion coating solution was coated simultaneously with the base layer coating solution by means of the cascade coating technique to a subbed polyethylene terephthalate support provided with a pack of two backing layers such that the base layer coating was coated directly to the side of the support opposite to the side containing said backing layers. The emulsion layer was coated such that the silver halide coverage expressed as $AgNO_3$ was 1.25 g/m$^2$ and the gelatin content was 1.35 g/m$^2$. The emulsion layers further contained 0.35 g/m$^2$ of 1-phenyl-4,4'-dimethyl-3-pyrazolidone and 0.13 g/m$^2$ of hydroquinone. The base layer was coated such that the amount of gelatin in the coated layer was 2.8 g/m$^2$.

The first subbing layer on the backside comprised 3.1 mg/m$^2$ of an antistatic composition consisting of 2.2 mg/m$^2$ of polystyrene sulphonic acid and 0.9 mg/m$^2$ of poly(3,4-ethylenedioxy-thiophene).

The layer nearest to the support of the backing layer pack contained 0.08 g/m$^2$ of gelatin. The second backing layer contained 2.8 g/m$^2$ of gelatin, 0.050 g/m$^2$ of a matting agent consisting of transparent spherical polymeric beads of 3 micron average diameter according to EP-A-080,225, 1.5 g/m$^2$ of dispersed barium sulfate (average diameter 0.8–1.1 mμ), 1.0 g/m$^2$ of colloidal silica, 0.05 g/m$^2$ of hardening agent triacrylformal, 9 mg/m$^2$ of non-perfluoro surfactants and 0.021 g/m$^2$ of wetting agent $F_{15}C_7$-COONH$_4$.

The thus obtained element was dried and subjected to a temperature of 40° C. for 5 days and then the emulsion layer was overcoated with a layer containing PdS at 0.69 mg/m$^2$ as physical development nuclei, hydroquinone at 0.4 g/m$^2$ and formaldehyde at 33 mg/m$^2$.

The imaging elements 1 to 11 differ by the kind of latex copolymer that is added to the base layer. The latices are given with their composition and their Tg in table 1.

The following processing solutions were prepared

| Activator | |
|---|---|
| sodium hydroxide (g) | 30 |
| sodium sulphite anh. (g) | 35 |
| 1-methyl,4-allyl,5-methyl 1,2,4-triazolium-3-thiolate (mg) | 1100 |
| 2-Aminoethyl-aminoethanol (ml) | 20 |
| 2-mercapto-5-n.heptyl-oxa-3,4-diazole (mg) | 350 |
| water to make | 1 l |
| Neutralization solution | |
| citric acid | 10 g |
| sodium citrate | 35 g |
| sodium sulphite anh. | 5 g |
| phenol | 50 mg |
| water to make | 1 l |

The above described imaging elements 1 to 11 were processed with the above described activator for 20 seconds at 30° C., subsequently neutralized at 25° C. with the neutralization solution described above and dried.

They were tested on their resistance to scratchability by the following procedure. The processed and dried imaging elements were wetted with demineralized water for 60 seconds. The wetted samples were scratched with sapphire bullets in a weight range from 69 g to 400 g. The results are given in table 1, wherein 0 means that no visible scratches were made at a load of 400 g, +means that visible scratches were made at a load between 200 and 400 g and X means that visible scratches were made at a load of less than 200 g.

TABLE 1

| No | Name[a] | Tg (°C.) | Scratchability | Composition[b] |
|---|---|---|---|---|
| 1 | Baystal T310C | 25 | 0 | ST/BD |
| 2 | Baystal S10 | 35 | 0 | ST/BD |
| 3 | Baystal S20C | 56 | X | ST/BD |
| 4 | Baystal S11 | 40 | + | ST/BD |
| 5 | Baystal P1600 | 0 | 0 | ST/BD |
| 6 | Acralen AFR | 2 | 0 | AA/AN |
| 7 | Acralen BS | 28 | 0 | ST/BD/AN |
| 8 | Acralen ATR | 10 | 0 | AA/ST |
| 9 | — | 62 | X | EA/MMA |
| 10 | — | 30 | 0 | EA/MMA |
| 11 | — | 5 | 0 | ST/IP |

[a])Baystal is the trade name of Bayer A.G. for a class of latex copolymers. Acralen is the trade name of Bayer A.G. for a class of latex copolymers
[b])The different monomers constituting the polymers are abbreviated as follows:
ST: styrene
BD: butadiene
AA: acrylic acid
AN: acrylonitrile
EA: ethylacrylate
MMA: methylmethacrylate
IP: isoprene It is clear that the wet scratchability of latices of copolymers having a Tg not higher than 40° C. is moderate (sample according to the invention 4, Tg=40° C.) to good (samples according to the invention 1, 2, 5, 6, 7, 8, 10, Tg at most 35° C.) where the wet scratchability of latices of copolymers having a Tg higher than 40° C. is bad (comparison samples 3 and 9).

I claim:

1. An imaging element comprising on a support in the order given (i) a base layer comprising a binder in an amount between 1 and 4 g/m$^2$, (ii) a photosensitive layer comprising a spectrally sensitised silver halide emulsion, and (iii) a receiving layer containing physical development nuclei in water permeable relationship with said photosensitive layer wherein the base layer contains a latex polymer with a glass transition temperature Tg not higher than 40° C.

2. An imaging element according to claim 1 wherein said glass transition temperature Tg is not higher than 35° C.

3. An imaging element according to claim 1 wherein said latex is a copolymer containing between 1 and 99 mole % of isoprene.

4. An imaging element according to claim 3 wherein said latex is a copolymer containing between 20 and 80 mole % of isoprene.

5. An imaging element according to claim 3 wherein said latex is a copolymer having as monomers at least isoprene and styrene and comprising between 10 and 90 mole % of isoprene and between 10 and 90 mole % of styrene.

6. An imaging element according to claim 5 wherein said latex comprises between 20 and 80 mole % of isoprene and between 20 and 80 mole % of styrene.

7. An imaging element according to claim 1 wherein the weight ratio between the binder and said latex ranges from 20 to 0.5.

8. An imaging element according to claim 1 wherein said silver halide emulsion comprises at least 95 mole % of silver chloride, between 0 and 5 mole % of silver bromide and between 0.1 and 1 mole % of silver iodide.

9. A method for making a lithographic printing plate comprising the steps of image-wise exposing an imaging element according to claim 1 and subsequently developing a thus obtained imaging element by an alkaline processing liquid in the presence of at least a developing agent and at least a silver halide solvent.

* * * * *